United States Patent [19]

Toyoda et al.

[11] Patent Number: 5,015,596
[45] Date of Patent: May 14, 1991

[54] METHOD OF MAKING A GAAS JFET WITH SELF-ALIGNED P-TYPE GATE BY OUTDIFFUSION OF DOPONT FROM THE METALLIC GATE

[75] Inventors: Nobuyuki Toyoda; Naotaka Uchitomi; Akimichi Hojo, all of Yokohama, Japan

[73] Assignee: Kabushiki Kaisha Toshiba, Kawasaki, Japan

[21] Appl. No.: 476,140

[22] Filed: Feb. 8, 1990

Related U.S. Application Data

[60] Division of Ser. No. 93,165, Sep. 3, 1987, abandoned, which is a continuation of Ser. No. 688,353, Jan. 2, 1985, abandoned.

[30] Foreign Application Priority Data

Apr. 18, 1984 [JP] Japan .................................. 59-77710

[51] Int. Cl.$^5$ .............................................. H01L 21/24
[52] U.S. Cl. ...................................... 437/41; 437/160; 437/911; 148/DIG. 88; 148/DIG. 82
[58] Field of Search .................. 437/160, 911, 41; 148/DIG. 88, DIG. 82

[56] References Cited

U.S. PATENT DOCUMENTS

| | | | |
|---|---|---|---|
| 3,601,888 | 8/1971 | Engeler | 437/160 |
| 3,768,151 | 10/1973 | Marinace | 437/160 |
| 4,234,357 | 11/1980 | Scheppele | 357/65 |
| 4,351,099 | 9/1982 | Takagi et al. | 437/911 |
| 4,380,774 | 4/1983 | Yoder . | |
| 4,433,470 | 2/1984 | Kameyama et al. . | |
| 4,452,646 | 6/1984 | Zuleeg | 357/61 |
| 4,495,512 | 1/1985 | Isaac et al. | 357/71 |
| 4,545,824 | 10/1985 | Salvi et al. | 357/65 |
| 4,586,968 | 5/1986 | Coello-Vera . | |
| 4,593,457 | 6/1986 | Birrittella | 357/34 |
| 4,843,033 | 6/1989 | Plumton et al. | 148/DIG. 19 |
| 4,912,053 | 3/1990 | Schrantz | 437/41 |
| 4,957,881 | 9/1990 | Crotti | 437/41 |

FOREIGN PATENT DOCUMENTS

| | | | |
|---|---|---|---|
| 013879 | 2/1979 | Japan | 357/71 |
| 986470 | 3/1965 | United Kingdom | 357/22 P |

OTHER PUBLICATIONS

GaAs JFET formed by localized Zn diffusion; M. Dohsen et al., IEEE Electron Device Letters ED4-2 No. 7, p. 157 (1981).
Fully ion-implanted GaAs ICs using normally-off JFETs, J. Kasahara et al.; Electronics Letters, vol. 17, No. 17 p. 621 (1981).
Abrokwah, J. K., IEEE Transactions on Electron Devices, vol. 37, #6, Jun. 1990, p. 1529.
Ghandhi, *VLSI Fabrication Principles*, Wiley-Interscience Pub. (1983), p. 248, p. 364 Line 16.

*Primary Examiner*—Brian E. Hearn
*Assistant Examiner*—Gordon V. Hugo
*Attorney, Agent, or Firm*—Oblon, Spivak, McClelland, Maier & Neustadt

[57] ABSTRACT

A GaAs JFET according to the present invention is formed as follows. First, an n type active layer is formed on a GaAs substrate. Then, a gate electrode containing a group II element is formed on the n type active layer. With the gate electrode being used as a mask, an n type impurity is ion-implanted in the GaAs substrate with a high concentration in a self-aligned fashion with respect to the gate electrode. Heat-treatment is then performed on the resultant structure to diffuse the group II element in the gate electrode into the n type active layer, forming a p type gate region. At the same time, the ion-implanted n type impurity is activated, forming source and drain regions.

11 Claims, 3 Drawing Sheets

METHOD OF MAKING A GAAS JFET WITH SELF-ALIGNED P-TYPE GATE BY OUTDIFFUSION OF DOPONT FROM THE METALLIC GATE

This application is a division of application Ser. No. 07/093,165 filed on Sept. 3, 1987, now abandoned, which is a continuation of application Ser. No. 06/688,353, filed on Jan. 2, 1985, now abandoned.

BACKGROUND OF THE INVENTION

1. Field of the Invention

This invention relates to a junction-field-effect transistor (JFET) with a self-aligned p type gate and a method of producing it.

2. Discussion of Background

JFETs with a GaAs substrate are well-known. FIG. 1 is the cross-sectional view of a typical configuration of the gate of such JFETs. On a semi-insulating GaAs substrate 1 is formed an n type active layer 3 in which a p type gate 5 is formed. A source and a drain 7, 9 are formed in the GaAs substrate 1 and the n type active layer 3. An insulating film 11, having contact holes on the gate 5, source and drain 7, 9 is formed on the n type active layer 3. A gate electrode 13 is formed on the gate 5 in such a manner that it contacts the gate 5 through the contact hole and partially overlaps the insulating film 11. A source electrode and a drain electrode 15, 17 are formed on the source and drain 7, 9.

A GaAs JFET with the configuration as shown in FIG. 1 can be produced by, for example, the following steps disclosed in the article "GaAs JFET Formed by Localized Zn Diffusion" in "IEEE ELECTRON DEVICE LETTERS, VOL. EDL-2, NO. 7, JULY."

First, the n type active layer 3 is formed on the semi-insulating GaAs substrate 1 by ion implantation. The source and drain 7, 9 are formed. The insulating film 11 is formed to cover the surfaces of the n type active layer 11 and the source and drain 7, 9. A contact hole is formed by, for example, photolithography in that portion of the film 11 under which a gate is to be formed. A high heat treatment is performed in metal vapor containing an acceptor impurity such as zinc (Zn). This diffuses the zinc into the n type active layer 3, forming the p type gate 5. The gate electrode 13 and source and drain electrodes 15, 17 are formed.

But, this method makes it difficult to control the compositions of the metal vapor, temperature, vapor flowing speed, etc. In particular, in order to suppress the discompose of arsenic contained in the GaAs substrate 1, the method requires that the arsenic be contained in the metal vapor. It is, however, extremely difficult to control the ratio of the arsenic in the metal vapor. This will not provide the gate 5 with a uniform depth (depth of a pn junction). Naturally, GaAs JFETs produced by the conventional method do not have good reproducibility characteristics. Particularly, the conventional method provides poor characteristic reproducibility for enhancement type GaAs JFETs, which require, finely controlled the junction depth of the gate 5 in the order of 0.1 μm.

To overcome the drawbacks of the aforementioned method, there has been proposed a GaAs JFET-producing method disclosed in, for example, Electronics Letters, Vol. 17, No. 17, pp. 621-623 entitled "Fully Ion-Implanted GaAs ICs Using Normally-Off JFETs" by J. Kasahara et al. According to this method, Zn ions are implanted in the n type active layer 3 with the insulating film 11 used as a mask and then the resulting structure is heat-treated, thus forming the p type gate 5. The second conventional method also gives rise to zinc diffusion by heat-treatment; therefore, it is very difficult to control the formation of a shallow pn junction.

Considering its characteristic, the JFET should desirably have a thin gate. However, the thinner the gate 5, the greater the gate resistance. In order to reduce the gate resistance, therefore, it has been necessary to form a metal film (gate electrode 13) on the gate 5. Both of the discussed methods form the gate electrode 13 by photolithography. Because this process needs some allowance for mask alignment, the gate electrode 13 partially overlaps the insulating film 11 as shown in FIG. 1. Consequently, a parasitic capacitance is produced between the gate electrode 13 and the n type active layer 3 and source and drain 7, 9 through the insulating film 11, reducing the operation speed of the JFET. In addition, as described above, the conventional methods should form the gate electrode 13, made of metal, after forming the gate 5, thus requiring an additional step.

In the field of MOSFETs, as disclosed in the Japanese Patent Disclosure (Kokai) No. 53-105984, there has been proposed a technique of improving a transconductance by providing a thin, high impurity p type layer under a gate electrode.

SUMMARY OF THE INVENTION

With the above in mind, it is an object of the present invention to provide a GaAs JFET with high characteristics and a high reproducibility and its manufacturing method.

A method of producing a GaAs JFET according to the present invention comprises the steps of:

forming an n type active layer on the surface region of a GaAs substrate;

forming a metal film with a high melting point, containing a group II element, on the n type active layer;

patterning the high melting point metal film to form a gate electrode;

ion-implanting an n type impurity at least in the n type active layer with a high concentration by using the gate electrode in a self-aligned fashion with respect to the gate electrode; and performing heat-treatment to diffuse the group II element, contained in the gate electrode, into the n type active layer for forming a p type gate and to activate the n type impurity implanted in the ion-implanting step to form a drain and a source.

This method uses the gate electrode as a solid phase diffusion source to form the gate. This makes the gate electrode forming step of the present invention simpler as compared with conventional methods which provide a gate before forming a gate electrode. In addition, the source, drain and gate can be formed by a single heat-treatment, reducing the heat-treating steps as compared with the conventional methods. This also makes the JFET producing steps of the present invention simpler than those of the conventional methods. That is, according to the present invention, JFETs can be fabricated as easily as Schottky FETs. Further, because a solid phase diffusion source is used (as described above), the pn junction of the gate is formed under good control. As a result, the JFETs fabricated by the method according to this invention have high characteristics and high reproducibility. Furthermore, unlike the conventional methods, the present method does not allow even a part of the gate electrode to overlap the insulating film. This solves the conventional problem of producing a parasitic capacity between the gate electrode and the source and drain through the insulating film. Accordingly, the so-produced JFETs will have a higher operation speed. Moreover, the gate is provided after forming the gate electrode, so that the gate resistance is sufficiently small without forming a metal film on the gate.

As given above, the method of the present invention has less and easier steps, and GaAs JFETs, produced by this method, have excellent characteristics.

DETAILED DESCRIPTION OF THE PREFERRED EMBODIMENT

A method of producing a GaAs JFET according to an embodiment of this invention will now be explained with reference to FIGS. 2 to 7.

Figure 1:
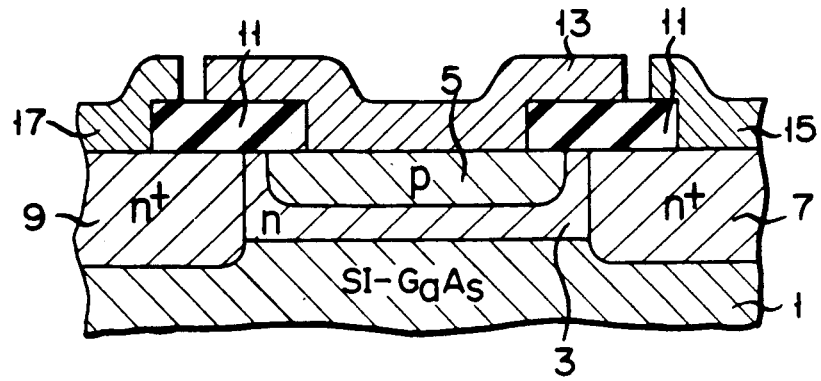
FIG. 1 is a partially-cut off cross-sectional view of a conventional GaAs JFET.
Figure 2:
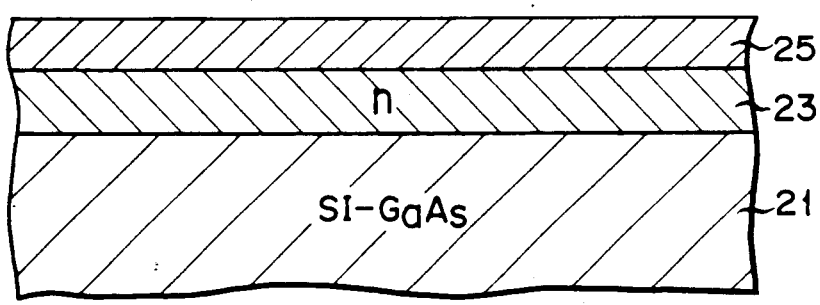
FIGS. 2 to 5 are cross-sectional views for explaining an example of the method of the present invention.

First, a semi-insulating GaAs substrate 21 doped with chromium (Cr) is prepared as shown in FIG. 2. Silicon (Si) ions are implanted in the GaAs substrate 21 to form an n type active layer 23. The Si ion implantation is performed, for example, at an acceleration voltage of 150 KeV at a dose of $3 \times 10^{12}$ ions/cm$^{-2}$. Then, capless annealing (first heat-treatment) is performed on the resultant structure at 850° C. for 15 min. in an arsenic ambience, activating the silicon in the n type active layer 23. On the surface of the n type active layer 23 is formed a 200 nm-thick wolfram film (hereafter referred to as W film) 25, which contains a group II element such as zinc of, e.g., 5 atomic percent formed on the surface of the n type active layer 23 by, for example, the RF sputtering. The RF sputtering uses a target obtained by hot-pressing a powder mixture of W and Zn.

Figure 3:
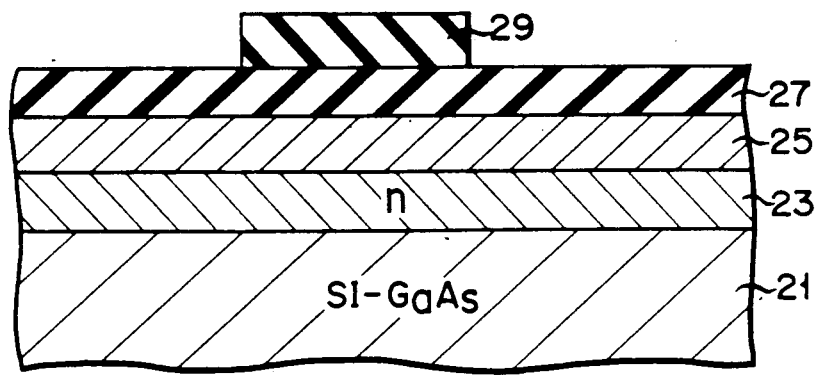

As shown in FIG. 3, a silicon oxide film 27 is then deposited on the high-melting point metal film 25 by, for example, the CVD method. Photolithography is used to form a photoresist mask 29 on that part of the silicon oxide film 27 under which a gate is to be provided.

Figure 4:
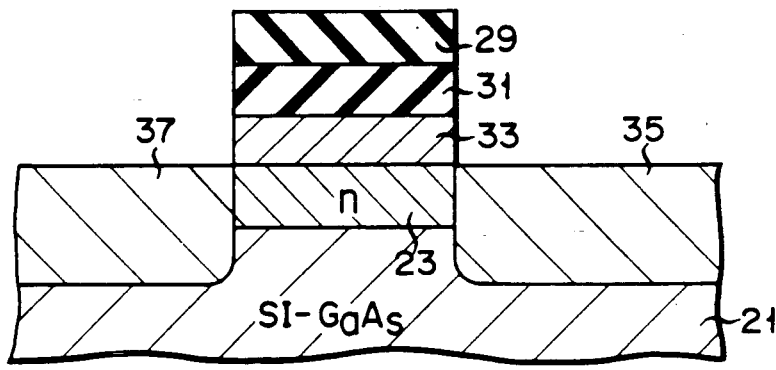

Then, as illustrated in FIG. 4, the photoresist mask 29 is used to etch the silicon oxide film 27 and the metal film 25 by plasma etching, forming a silicon mask 31 and a gate electrode 33. With the photoresist mask 29, silicon mask 31 and gate electrode 33 (also as a mask) being used, Si ions are implanted in those surface regions of the GaAs substrate 21 (the GaAs substrate 21 and the n type active layer 23) in which a source and a drain are to be formed, thus forming n type high concentration-ion-implantation layers 35 and 37. The ion implantation is performed, for example, at an acceleration voltage of 150 KeV at a dose of $5 \times 10^{13}$ ions/cm$^2$. Then, the photoresist mask 29 and the silicon mask 31 are removed.

Figure 5:
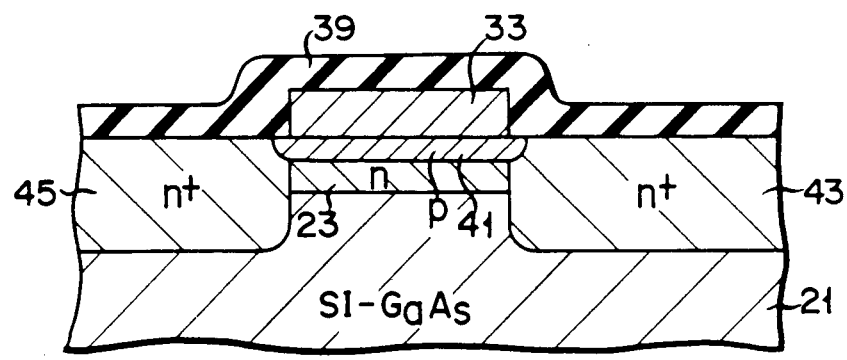

Next, as shown in FIG. 5, phospho-silicate glass (PSG) is deposited on the whole surface of a wafer by, for example, the CVD method, forming a PSG film 39. Another heat-treatment (second one) is carried out on the wafer at 800° C. for 30 min. The second heat-treatment permits zinc atoms contained in the gate electrode 33 to be diffused into the n type active layer 23, forming a p type gate 41 therein. At the same time, silicon atoms in the ion implantation regions 35, 37 are activated, forming an n type source 43 and an n type drain 45 both having a high concentration. Then, contact holes are formed in the PSG film 39 (see FIG. 6). Ohmic electrodes 47 and 49, which are made of an alloy of gold (Au), germanium (Ge) and nickel (Ni), are respectively formed on the source 43 and the drain 45.

Figure 6:
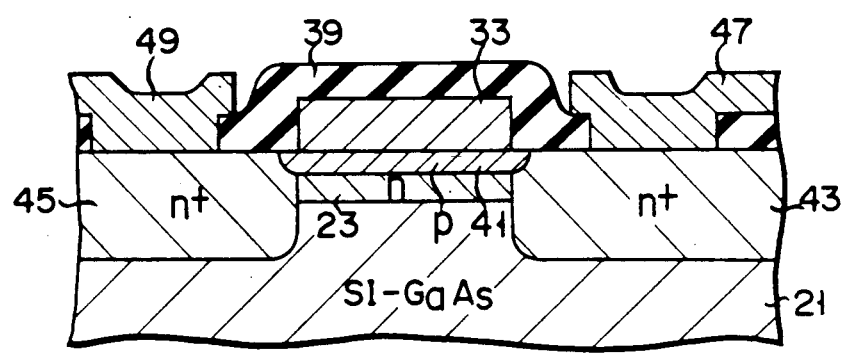
FIG. 6 is a partially-cut-off cross-sectional view illustrating the structure of a GaAs JFET fabricated by the method shown in FIGS. 2 to 5.
Figure 7:
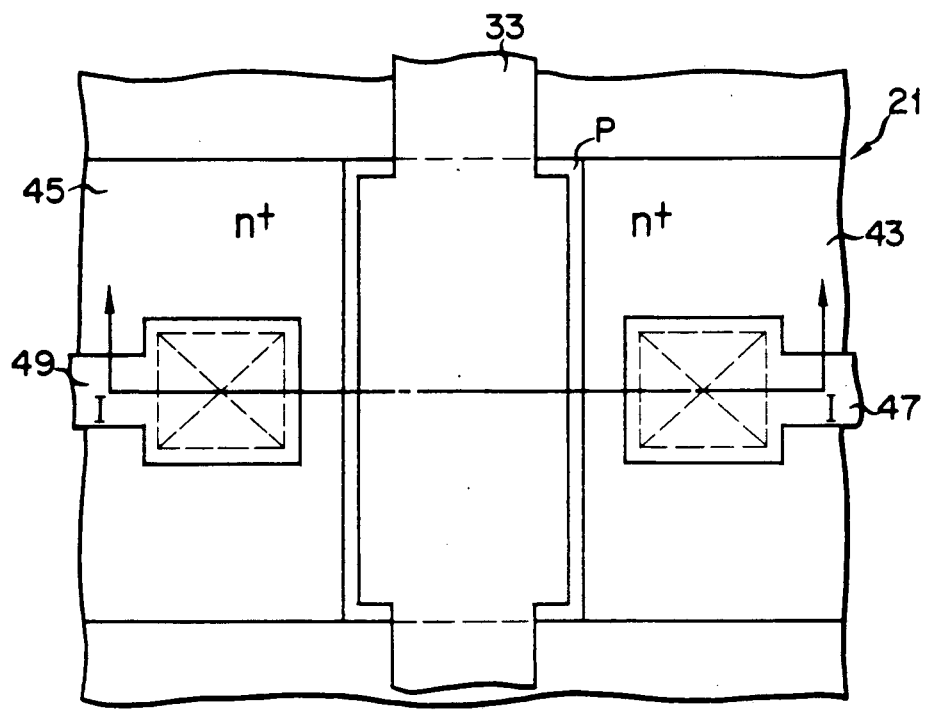
FIG. 7 is a partially-cut off plan view of the GaAs JFET illustrated in FIG. 6.

Through the above-described steps, the GaAs JFET illustrated in FIGS. 6 and 7 is formed. FIG. 6 is a cross-sectional view of the GaAs JFET along the line I—I shown in FIG. 7 as viewed in the direction of the arrows. In FIG. 7, some parts such as the PSG film 39 are omitted for easier explanation of the positional relationships between the individual parts.

The GaAs JFET fabricated by the aforementioned method of the present invention has the following arrangement. The n type active layer 23 is formed in a surface region of the semi-insulating GaAs substrate 21. The gate electrode 33, made of 200 nm-thick wolfram containing zinc of 5 atomic percent, is formed on a specific location on the n type active layer 23. The p type gate 41, which is self-aligned with the gate electrode 33, is formed in the n type active layer 23. The gate 41 is sandwiched between the source 43 and drain 45, which are self-aligned with the gate electrode 33 and do not overlap the gate electrode 33. The ohmic contacts 47 and 49, made of, for example, an alloy of gold, germanium and nickel, are formed on the source 43 and the drain 45.

According to the aforementioned method of the present invention, the gate 41 is formed with the gate electrode 33 being used as a solid phase diffusion source. This makes the present method simpler than the conventional methods which form the gate electrode after the gate is formed. In addition, the source 43, drain 45 and gate 41 can be formed by a single heat-treatment, reducing the heat-treating steps as compared with the conventional methods. This also makes the JFET producing steps of the present invention simpler than those of the conventional methods. That is, the present invention permits JFETs to be fabricated as easily as Schottky FETs. Further, because a solid phase diffusion source is used as described above, the pn junction of the gate 41 is formed under good control. As a result, the JFETs fabricated by the method according to this invention have high characteristics and high reproducibility. Furthermore, unlike the conventional methods, the present method does not allow even a part of the gate electrode 33 to overlap the insulating film. This solves the conventional problem of producing a parasitic capacity between the gate electrode and the source and drain through the insulating film. Accordingly, the so-produced JFETs will have a higher operation speed. Moreover, the gate 41 is provided after formation of the gate electrode 33; therefore, the gate resistance is sufficiently small without forming a metal film on the gate.

As given above, the method of the present invention has less and easier steps, and GaAs JFETs, produced by this method and with the above-described structure, have excellent characteristics and reproducibility. Further, unlike conventional GaAs JFETs, the GaAs JFETs according to the present invention have no insulating film between the gate electrode 33 and the source 43 and the drain 45, thus preventing generation of parasitic capacities therebetween. Accordingly, the JFETs will have a higher operation speed.

With the above-described method, a JFET was experimentally manufactured under the following conditions:
  a) Thickness of the gate electrode 33: 200 nm.
  b) Ratio of zinc in the gate electrode 33: 5 atomic percent.
  c) Heat-treatment temperature: 800° C.
  d) Heat-treatment period: 30 min.

This experiment has produced an enhancement type GaAs JFET with a threshold voltage of +0.08 V. In this experiment, the gate resistance was determined based almost on the resistance of the gate electrode 33; it was 34 Ω for a gate size of 20 μm × 1.5 μm.

Figure 8:
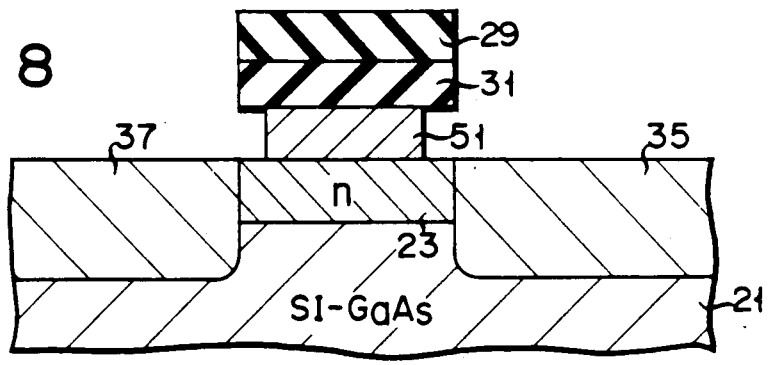
FIG. 8 is a partially-cut off cross-sectional view for explaining another example of the method of the present invention.
Figure 9:
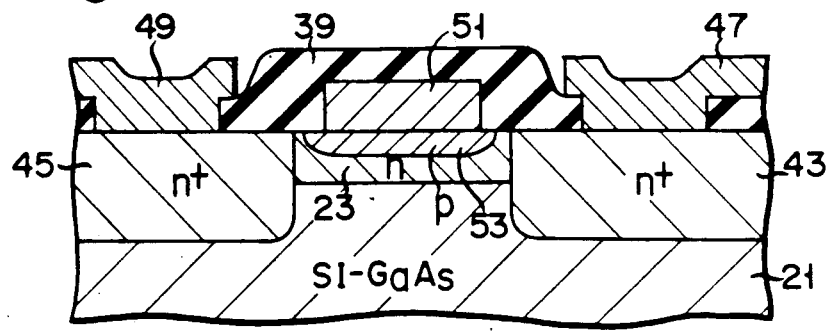
FIG. 9 is a partially-cut off cross-sectional view of the GaAs JFET fabricated by the second example of the method of the present invention.

Another embodiment of the present invention will now be explained in conjunction with FIGS. 8 and 9 in which for ease of understanding, the reference numerals used in FIGS. 2 to 7 to identify various elements are utilized to identify the same elements. According to the first embodiment, the gate 41 contacts the source 43 and the drain 45 (see FIG. 6). This structure produces undesirable capacitances between the gate electrode 41 and the source 43 and drain 45, which prevents speed-up of the operation of the JFET. The second embodiment solves this problem.

First, like the first embodiment, a W film 25, a silicon oxide film 27 and a photoresist mask 29 are formed in that order (see FIG. 3). Then, the photoresist mask 29 and the silicon mask 31 are used as a mask to overetch the W film 25. This etching, which is an isotropic etching, forms a gate electrode 51 that is smaller than the mask 31. Here, the ratio of the width of the mask 31 to that of the gate electrode 51 is preferably from, for example, 1:0.6 to 1:0.9 though the ratio is not limited to that range. Like the first embodiment, with the photoresist mask 29 and silicon mask 31 being used as a mask, an n type impurity is then ion-implanted into the n type active layer 23 and the GaAs substrate 21. As is performed in the first embodiment, the second heat-treatment is carried out to form a source 43 and a drain 45. At the same time, zinc atoms in the gate electrode 51 are diffused into the n type active layer 23, forming a gate 53. The gate electrode 51, a source of diffusing a p type impurity, is sufficiently small so that the gate 53 will not contact the source 43 and the drain 45. This prevents the generation of the undesirable capacitances between the gate 53 and the source 43 and drain 45, thus speeding up the operation of the JFET.

In the above-described two embodiments, the second heat-treatment is executed to activate the impurity (silicon) in the n type active layer 35 or 37 and diffuse the zinc atoms from the gate electrode 51 into the n type active layer. For this purpose, the second heat-treatment should be performed at 600° C. or above. The upper limit of the temperature is based on the melting point of the gate electrodes 33 and 51 and rediffusion of the impurity in the n type active layer 23; the temperature range is preferably from 600° C. to 800° C. The depth of the pn junction of the gate 41 or 53 can be controlled with a high precision by controlling the temperature and the time for the heat-treatment.

Both embodiments are explained with the case where the gate electrode 33 or 51 has a thickness of 200 nm and contains zinc of 5 atomic percent. The present invention is not, however, limited to that case although proper fabrication and characteristics desirably require that the gate electrode thickness and zinc ratio respectively range from 100 nm to 300 nm and from 3 to 20 atomic %.

According to both embodiments discussed above, the gate electrode 33 or 51 is made of wolfram containing zinc. Instead of wolfram, however, the present invention may employ other metals with a high melting point such as molybdenum (Mo) and tantalum (Ta) or silicides or nitrides of such metals. Furthermore, the gate electrode 33 or 51 may contain beryllium (Be) or magnesium (Mg) or other group II elements instead of zinc.

Both of the embodiments use a target containing a group II element to form the W film 25 by sputtering; however, the W film formation is not limited to such a step. For example, a target consisting of a high-melting point metal and another target consisting of a group II element may be provided separately and then simultaneously subjected to sputtering, thus forming the W film 25.

According to the aforementioned embodiments, the W film 25 is formed by carrying out sputtering on a target which precontains a group II element. With this method, the composition of the target strongly influences the characteristic of thus-produced JFETs. For example, when the distribution of the group II element in the target is uneven, the distribution of the group II element in the gate electrode 33 becomes uneven, eventually making the depth of the pn junction of the gate 41 uneven. This fluctuates the characteristics of the JFETs. Particularly, as described above, the depth of the pn junction creates a significant problem for an enhancement type JFET. This significantly influences the control of the threshold value of the JFET, which has the p type impurity unevenly distributed in the target. The method proposed below is effective in dealing with such problem.

First, sputtering is performed to form a high-melting point metal, containing no group II element, on an n type active layer 23. Then, a group II element is ion-implanted in the metal film, forming a W film 25 containing an impurity (as shown in FIG. 2). This W film 25 serves to accurately control the distribution and density of the impurity, resulting in accurate control of the depth of the pn junction of a gate 41.

The method has been used to experimentally produce a JFET. First, an n type active layer was formed on a semi-insulating GaAs substrate. On the active layer was formed a W film with a thickness of 200 nm, which did not contain any impurity. Then, magnesium ions were implanted in the W film at an acceleration voltage of 150 KeV at a dose of $5 \times 10^{14}$ ions/cm$^2$, providing a W film with an impurity. In this case, all the magnesium ions stayed within the W film. A gate electrode was then formed from the W film. The magnesium ions in the gate electrode were diffused in the n type active layer by heat-treatment, providing a JFET similar to the one produced according to the second embodiment. The heat-treatment was performed at 800° C. for 15 minutes. The reason for short heat-treatment is that the diffusion speed of magnesium is faster than that of zinc. Thus-produced JFET had a threshold value of +0.08

V. The reasons for selecting magnesium as a group II element are that magnesium has a smaller mass than zinc and that magnesium ions can be implanted deep in the W film by an ordinary ion implanting device (maximum acceleration voltage: 200 KeV). For the same reasons, beryllium may be used as a group II element, giving the same effect. The JFET fabricated by the third method had an excellent reproducibility.

The aforementioned embodiments employ a semi-insulating GaAs substrate; however, the substrate is not limited to such a type. A p type GaAs substrate can be used to provide a JFET.

According to those embodiments, the n type active layer 23 is formed by ion-implantation in the GaAs substrate 21. The active layer may, however, be formed by epitaxial growth.

What is claimed is:

1. A method of producing a GaAs JFET comprising the steps of:

forming an n type active layer in the surface region of a GaAs substrate;

forming a metal film with a high-melting point, containing a group II element, on said n type active layer;

patterning said high-melting point metal film to form a gate electrode;

ion-implanting an n type impurity at least in said n type active layer with a high concentration by using said gate electrode as an implantation-mask in a self-aligned fashion with respect to said gate electrode, an edge portion of said gate electrode corresponding to that of said implantation-mask; and performing heat-treatment to diffuse said group II element, contained in said gate electrode, into said n type active layer for forming a p type gate and to activate the n type impurity implanted in the ion-implanting step to form a drain region and a source region.

2. A method according to claim 1, wherein said heat treatment is performed at a temperature ranging from 600° C. to 800° C.

3. A method according to claim 1, wherein said high-melting point metal film is made of one of tantalum, molybdenum, tungsten, tantalum silicide, molybdenum silicide, tungsten silicide, tantalum nitride, molybdenum nitride and tungsten nitride, and contains one of beryllium, magnesium and zinc as a group II element.

4. A method according to claim 1, wherein said step of forming said high-melting point metal film comprises the steps of:

forming a target by hot-pressing a powder mixture of a high-melting point metal and a group II element; and performing a sputtering operation using said target to form said high-melting point metal film on said n type active layer.

5. A method according to claim 1, wherein said high-melting point metal film is formed by simultaneously subjecting a first target made of a high-melting point metal and a second target made of a group II element to sputtering.

6. A method according to claim 1, wherein said step of forming said high-melting point metal film comprises the steps of:

forming a high-melting point metal layer on said n type active layer; and implanting ions of a group II element in said metal layer.

7. A method according to claim 1, wherein said n type active layer is formed by ion-implanting an n type impurity in said GaAs substrate.

8. A method according to claim 1, wherein said n type active layer is formed by growing an n type GaAs layer on said GaAs substrate by epitaxial growth.

9. A method according to claim 1, further comprising a step of forming at least one etching mask on said high-melting point metal film, and a step of etching said high-melting point metal film so as to have the same shape as that of said etching mask by using said etching mask.

10. A method according to claim 1, wherein said semiconductor substrate is a semi-insulating GaAs substrate.

11. A method according to claim 10, wherein said ion-implanting step and said heat treatment step include a step of forming source and drain regions each of which is deeper than said n type active layer.

* * * * *